(12) United States Patent
Chan et al.

(10) Patent No.: US 9,769,925 B2
(45) Date of Patent: Sep. 19, 2017

(54) RELIEVED COMPONENT PAD FOR 0201 USE BETWEEN VIAS

(71) Applicant: ALCATEL-LUCENT CANADA INC., Ottawa (CA)

(72) Inventors: Alex L. Chan, Nepean (CA); Paul J. Brown, Wakefield (CA)

(73) Assignee: Alcatel Lucent, Boulogne-Billancourt (FR)

( * ) Notice: Subject to any disclaimer, the term of this patent is extended or adjusted under 35 U.S.C. 154(b) by 0 days.

(21) Appl. No.: 14/941,327

(22) Filed: Nov. 13, 2015

(65) Prior Publication Data

US 2017/0142831 A1 May 18, 2017

(51) Int. Cl.
| | |
|---|---|
| *H05K 1/11* | (2006.01) |
| *H05K 1/18* | (2006.01) |
| *H05K 3/00* | (2006.01) |
| *H05K 3/34* | (2006.01) |
| *H05K 1/02* | (2006.01) |

(52) U.S. Cl.
CPC ............. *H05K 1/113* (2013.01); *H05K 1/114* (2013.01); *H05K 1/18* (2013.01); *H05K 1/181* (2013.01); *H05K 3/0005* (2013.01); *H05K 3/3421* (2013.01); *H05K 3/3452* (2013.01); *H05K 1/023* (2013.01); *H05K 2201/10674* (2013.01)

(58) Field of Classification Search
CPC .... H05K 1/113; H05K 3/0005; H05K 3/3452; H05K 1/114; H05K 3/3421; H05K 1/18
See application file for complete search history.

(56) References Cited

U.S. PATENT DOCUMENTS

| | | | | |
|---|---|---|---|---|
| 7,256,495 | B2 * | 8/2007 | Lee ..................... | H01L 21/4846 174/255 |
| 7,602,615 | B2 * | 10/2009 | Chan .................... | H05K 1/0231 174/261 |
| 7,906,734 | B2 * | 3/2011 | Del Rosario ......... | H05K 1/023 174/261 |
| 2002/0066949 | A1 * | 6/2002 | Ahn ...................... | H01L 21/486 257/684 |
| 2012/0168216 | A1 * | 7/2012 | Chan .................... | H05K 1/0231 174/260 |

* cited by examiner

*Primary Examiner* — Ishwarbhai B Patel
(74) *Attorney, Agent, or Firm* — Kramer & Amado, P.C.

(57) ABSTRACT

A relieved component pad for 0201 component use between vias on a tight-pitch Ball Grid Array is disclosed herein. The relieved component pad for 0201 component use between vias provides substantially rectangular component pads having a relieved section at a point of closest approach to a via pad. The relieved component pad for 0201 component use is particularly useful for overcoming the problem of 0201 component placement on tight-pitch arrays known in the art.

7 Claims, 3 Drawing Sheets

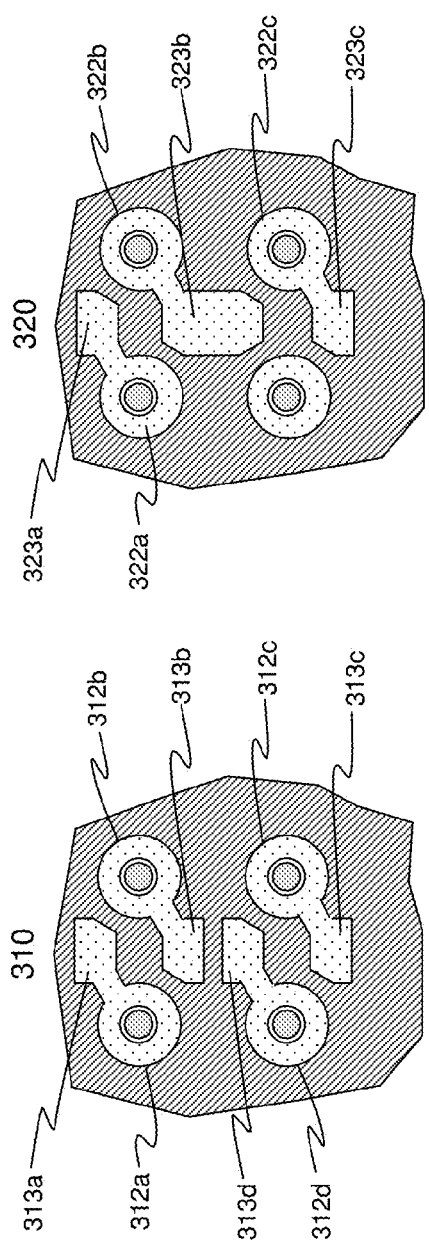
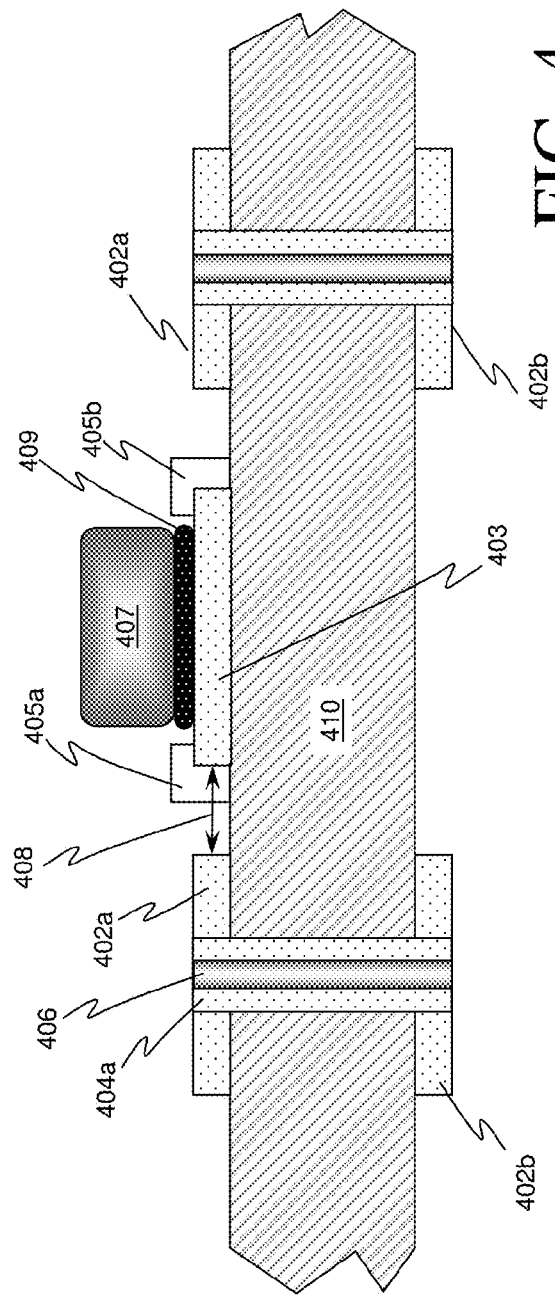

RELIEVED COMPONENT PAD FOR 0201 USE BETWEEN VIAS

TECHNICAL FIELD

The present invention relates to a printed circuit board pad design and is particularly concerned with maintaining insulative spacings on very tight-pitch grid arrays.

BACKGROUND

High-speed electronic applications require the mounting of very small components, for example decoupling capacitors, on very tight-pitch grid arrays of, for example 0.8 mm by 0.8 mm, which are compatible with Ball Grid Array (BGA) components.

One approach which can provide sufficient spacing within the BGA grid pattern is a technology known as Via In Pad Plated Over (VIPPO) which provides circuit board vias placed in the Ball Grid Array circuit board pads. This frees up space on the outer layer which may be used for component placement. However, VIPPO technology has an increased manufacturing cost associated with its use, a cost which can be on the order of 10% to 25% higher than normal plated through hole technologies.

Therefore, it would be desirable to provide a method of placing small components within tight-pitch BGA grids while avoiding the extra cost associated with more complex and costly circuit board technologies such as Via In Pad Plated Over technologies.

SUMMARY

A brief summary of various exemplary embodiments is presented below. Some simplifications and omissions may be made in the following summary, which is intended to highlight and introduce some aspects of the various exemplary embodiments, but not to limit the scope of the invention. Detailed descriptions of a preferred exemplary embodiment adequate to allow those of ordinary skill in the art to make and use the inventive concepts will follow in later sections.

According to an aspect of the invention there is provided a through-hole printed circuit board (PCB) having: a ball grid array (BGA) of BGA pads on one side of the PCB, arranged in a tight-pitch grid pattern; through-hole vias, including respective via pads, arranged in the grid pattern and at least one of the through-hole vias electrically connected to the BGA pads; substantially rectangular component pads on the opposite side of the PCB from the BGA pads, the component pads located between pairs of the through-hole vias; each substantially rectangular component pad having a relieved section at a point of closest approach to a via pad; a solder mask covering the component pad with an opening; a solder pad within the opening electrically connected to the component pad; and a two-lead component attached to the solder pad.

In some embodiments of this aspect of the invention the grid pattern is square. In other embodiments of this aspect of the invention the grid pattern is rectangular.

In some embodiments of this aspect of the invention the grid pattern has 0.8 mm pitch.

In some embodiments of this aspect of the invention the two-lead component is an Imperial 0201 component. In some of these embodiments the Imperial 0201 component is a discrete component. In some of these embodiments the Imperial 0201 component is a capacitor.

According to another aspect of the invention there is provided a method of manufacturing a PCB having the steps of: selecting two adjacent through-hole vias on a printed circuit board (PCB), wherein each via has a corresponding via pad, wherein the PCB has a ball grid array (BGA) of BGA pads on one side of the PCB arranged in a grid pattern, wherein the PCB has an array of substantially rectangular component pads on the opposite side of the PCB from the BGA pads, the component pads located between pairs of the through-hole vias, and wherein each substantially rectangular component pad having a relieved section at a point of closest approach to a via pad; covering each component pad with a respective solder mask; removing areas from the solder masks; placing solder pads in the areas; and attaching a two-lead component to the two adjacent component pads using the solder pads.

In some embodiments of this aspect of the invention the grid pattern is square. In other embodiments of this aspect of the invention the grid pattern is rectangular.

In some embodiments of this aspect of the invention the grid pattern has 0.8 mm pitch.

In some embodiments of this aspect of the invention the two-lead component is an Imperial 0201 component. In some of these embodiments the Imperial 0201 component is a discrete component. In some of these embodiments the Imperial 0201 component is a capacitor.

According to yet another aspect of the invention there is provided a computer aided design tool implemented on a computing device for accommodating a two-lead component on in a 0.8 mm by 0.8 mm pitch ball grid array (BGA) printed circuit board (PCB) having: a design tool mode configured to select two adjacent through-hole vias on the printed circuit board (PCB) for connection to a two-lead component; a design tool mode configured to identify a placement of substantially rectangular component pads on the opposite side of the PCB from the BGA pads, the component pads located between pairs of the through-hole vias, wherein each substantially rectangular component pad having a relieved section at a point of closest approach to a via pad; a design tool mode configured to identify a placement of pads and shape of solder pads on two adjacent component pads, wherein the placement allows a two-lead component to connect to two adjacent component pad, and wherein the spacing between component pads and adjacent non-connected vias meets a pre-established requirement.

BRIEF DESCRIPTION OF THE DRAWINGS

In order to better understand various exemplary embodiments, reference is made to the accompanying drawings, wherein:

FIG. 3 shows alternative connection arrangements between via pads and component pads according to an embodiment of the invention; and FIG. 4 illustrates a cross sectional view of the fine-pitch through-hole circuit board of FIG. 1 having a component mounted thereon.

To facilitate understanding, identical reference numerals have been used to designate elements having substantially the same or similar structure and/or substantially the same or similar function.

DETAILED DESCRIPTION

Figure 1:
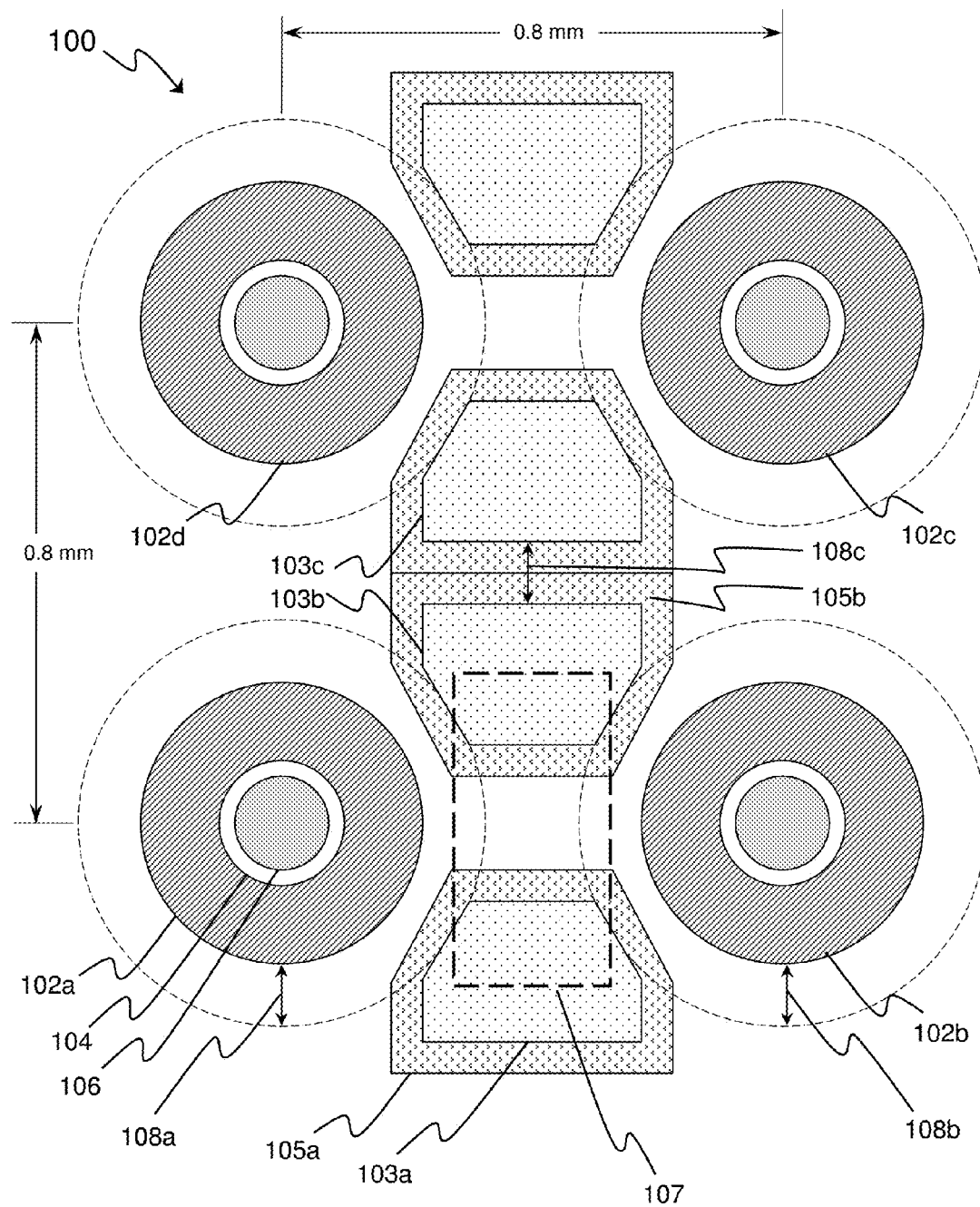
FIG. 1 shows a bottom view of a portion of a fine-pitch through-hole circuit board according to an embodiment of the invention.

The description and drawings merely illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments may be combined with one or more other embodiments to form new embodiments.

Referring now to the drawings, in which like numerals refer to like components or steps, there are disclosed broad aspects of various exemplary embodiments.

FIG. 1 shows a bottom view of a portion of a fine-pitch through-hole circuit board according to an embodiment of the invention. This includes a portion of a circuit board 100, which contains a standard ball grid array (BGA) of BGA pads on the top side (not shown) and a set of through-hole vias also arranged on a grid spaced which is offset from the BGA pad grid, such that they do not overlap the BGA pads. The through-hole vias have pads 102 which are labeled (102a, 102b, 102c, and 102d), but other through-hole vias may be present. In an exemplary embodiment BGA pads 102 form a 0.80 mm pitch grid, meaning that through-hole vias pads 102a, 102b, 102c, and 102d are spaced 0.80 mm center-to-center apart in a square grid.

The standard structure of the through-hole vias includes via pad 102a and through-hole via 106, having via barrel 104. Typically, through-hole via pad 102a will be substantially circular in shape; through-hole via 106 will be substantially circular in shape and have a radius of 0.25 mm. All dimensions may have a tolerance of ±10%. Via barrel 104 has an outer radius to fit in through-hole via 106.

Further evident in FIG. 1 is component pad 103 upon which a terminal of a surface-mount component may be soldered. Component pad 103a has solder resist layer 105a overprinted upon it. The outline of a two-terminal surface mount component 107 is indicated by the dashed lines. Likewise, component pad 103b having solder resist layer 105b is located at the other end of the two-terminal surface mount component outline 107.

In an exemplary embodiment, two-terminal surface mount component depicted by outline 107 is a two-lead 0201 component, having a length of 0.5 mm and a width of 0.25 mm. In the embodiment the two-terminal surface mount component is a discrete component. In some cases, this component is a capacitor that can be used for decoupling. As will be further described in FIG. 3, component pads 103 may be connected via conductive copper paths to via pads 102 as required for various layout configurations.

Through-hole via pad 102a has an insulative offset distance 108a indicated by the dashed line surrounding the via pad. Likewise may be seen an insulative offset distance 108b relative to through-hole via pad 102b. This offset distance is the requisite spacing required to provide reliable electrical separation between the through-hole via pads and other copper features on the printed circuit board. In order to meet these insulative spacing requirements, component pad 103a and component pad 103b have truncated portions which avoid the insulative offset region, while maintaining sufficient landing area to allow surface mount soldering of two-lead 0201 components.

While these truncated portions are evident in relation to the insulated offset distances as indicated at 108a and 108b, one skilled in the art will recognize that the same insulative distance will be maintained to through-hole via pads 102c and 102d. Further, as indicated at 108c, this insulative offset distance may also be maintained between component pads, in this case component pad 103b and 103c.

Figure 2:
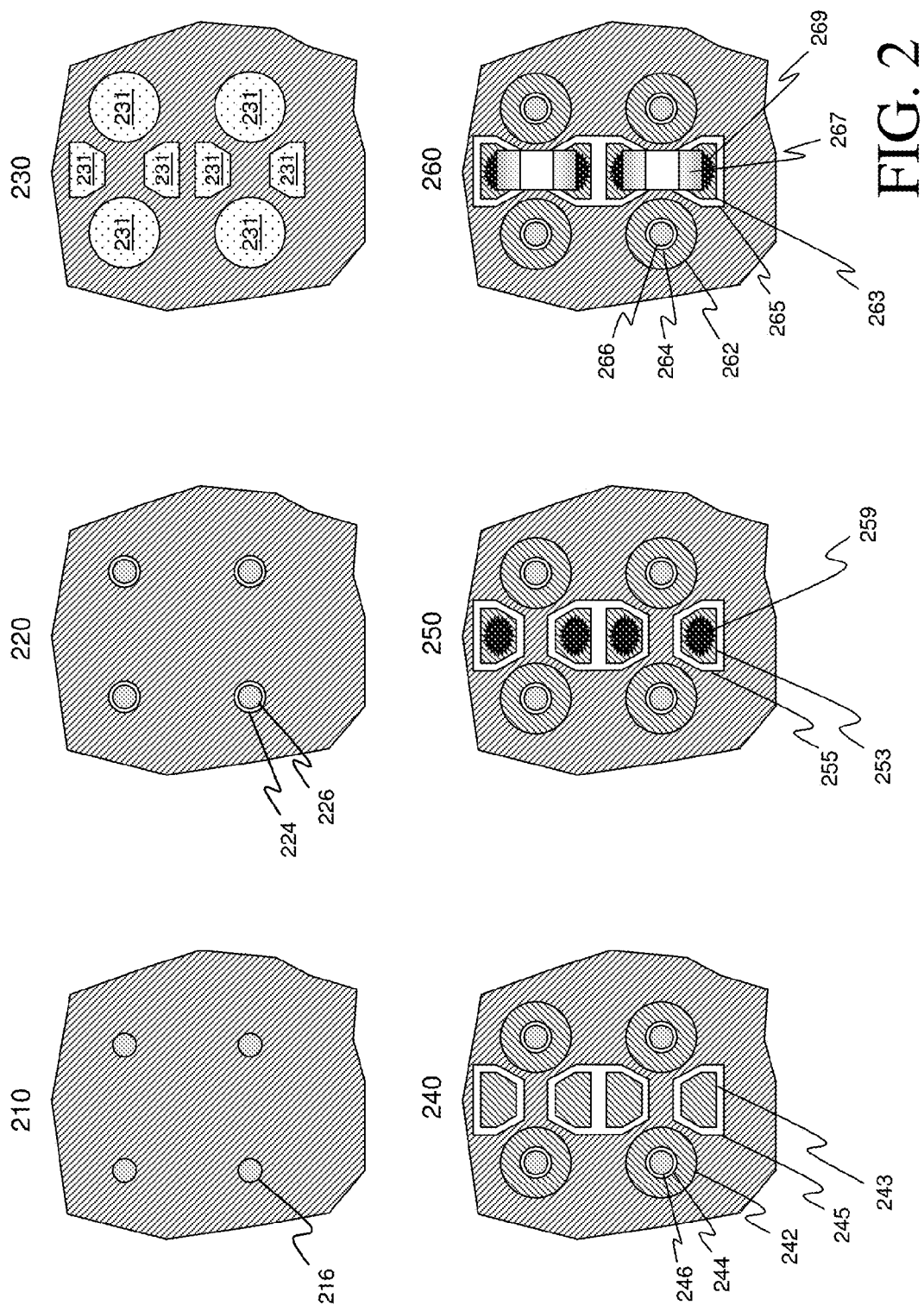
FIG. 2 shows a sequential embodiment of a process for attaching a surface mount component according to an embodiment of the invention.

FIG. 2 illustrates a sequential embodiment of a process for attaching a pair of surface mount components according to an embodiment of the invention. The method generally consists of steps 210, 220, 230, 240, 250, and 260. The final product results in the structure depicted in FIG. 4.

At step 210, four adjacent through-holes are produced in a circuit board. A single such hole is indicated at 216.

At step 220 the holes are coated with a conductive material, such as copper, producing a via barrel. Other via construction methods are recognized by those skilled in the art. A single such barrel is indicated at 224 for hole 226.

At step 230, the adjacent vias are entirely covered with etch resist 231. In an exemplary embodiment, etch resist 231 is a thin layer of a nonconductive polymer which will resist the acids used to remove copper from portions of the printed circuit board.

At step 240 in an exemplary embodiment, via pad 242, via barrel 244 and through-hole 246 may be seen after etching is complete and the etch resist 231 removed. Also visible are component pad 243 and solder mask 245. Solder mask 245 is a thin layer of a nonconductive polymer. Solder mask 245 prevents the copper portions of the via from oxidizing and prevents unintended solder bridges from accidentally forming on the circuit board. Solder mask may be applied using a silkscreen process.

At step 250, solder paste 259 is applied to component pad 253 within the boundaries of solder mask 255.

At step 250, a portion of solder mask 255 corresponding to a component landing area on component pad 253 is removed. This may be accomplished by etching the solder mask to remove material. In an exemplary embodiment solder mask 255 is modified using photolithography. However, other processes may be used to remove a portion of solder mask 255. Solder paste 259 is applied to component pad 253 within the boundaries of removed portion of solder mask 255.

At step 260, component 267 is attached to component pad 263 using reflowed solder paste 269. Solder mask 265 acts as a part of a barrier between via pad 262 and component pad 263, preventing solder bridging from occurring during the attachment process.

The steps 210, 220, 230, 240, 250 and 260 may be carried out by a computer controlled machine. In an exemplary embodiment, a computer aided design tool allows the selection of vias and arrangement of the solder mask, solder pad, and component to be substantially automated. The computer aided design tool may automatically identify appropriate spacing and shape of the solder pad to place standard components on a BGA. A computer aided design tool may also provide instructions to control a machine to manufacture the modified circuit board. Instructions may be exported to the machine or the design tool may directly control the machine.

FIG. 3 shows alternative connection arrangements between via pads and component pads according to an embodiment of the invention. Referring to element 310 there may be seen a bottom view of a through-hole printed circuit board having via pads 312a, 312b, 312c, and 312d; as well as component pads 313a, 313b, 313c, and 313d. The via pads are electrically coupled to the respectively numbered component pads by short sections of conductive copper. The spacing between component pads 313b and 313d provide the required insulative offset, allowing separate two-lead 0201 components to be mounted between component pads 313a and 313b; and between 313c and 313d.

Referring to element 320 there may be seen a bottom view of a through-hole printed circuit board having via pads 322a, 322b, 322c, and 322d; as well as component pads 323a, 323b, 323c, and 323d. The via pad 322a is electrically coupled to the component pad 323a, and likewise, the via pad 322c is electrically coupled to the component pad 323c. Via pad 322b is electrically coupled to the component pad 323b. In this exemplary embodiment component pad 323b has been elongated so that it may serve as an attachment point for two separate two-lead 0201 components: one attached between component pad 323a and 323b, and the other between 323c and 323b. This particular layout arrangement could find application where via pad 322b is connected to a ground or power rail, for example, and decoupling capacitors are desired to be connected from vias 323c and 323a.

FIG. 4 illustrates a cross sectional view of the fine-pitch through-hole circuit board of FIG. 1 having a component mounted thereon. This view applies to both the device formed at step 260 of FIG. 2 and attached component depicted in outline 107 of FIG. 1.

Printed Circuit Board (PCB) 410 has vias with via pads 402a and BGA pads 402b, conductive via barrel 404a connective the via pads 402a and 402b; and through-hole 406. Component pad 403 has solder mask 405a and 405b. Reflowed solder 409 electrically connects component 407 to component pad 409. Component pad 409 maintains an appropriate insulative distance 408 from via pad 402a.

Thus what has been disclosed is a method of placing small components within tight-pitch BGA grids while avoiding the extra cost associated with more complex and costly circuit board technologies.

While the figures and descriptions may depict regular circular or rectangular shapes of different elements in exemplary embodiments, it should be understood that alternative shapes may be used such as imperfect polygons and rounded forms. These alternative shapes may be substantially similar to the depicted shapes in area and outline.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be effected while remaining within the spirit and scope of the invention. Accordingly, the foregoing disclosure, description, and figures are for illustrative purposes only and do not in any way limit the invention, which is defined only by the claims.

What is claimed is:

1. A through-hole printed circuit board (PCB) comprising:
    a ball grid array (BGA) of BGA pads on one side of the PCB, arranged in a 2×2 tight-pitch grid pattern including first, second, third, and fourth BGA pads;
    through-hole vias, including respective via pads, arranged in said 2×2 tight-pitch grid pattern including first, second, third, and fourth through-hole vias, and at least one of said through-hole vias electrically connected to said BGA pads;
    substantially rectangular component pads on the opposite side of the PCB from said BGA pads including first, second, third, and fourth component pads, said component pads located between pairs of said through-hole vias;
    each substantially rectangular component pad having a relieved section at a point of closest approach to a via pad;
    a solder mask covering the component pad with an opening;
    a solder pad within said opening electrically connected to said component pad; and
    a first two-lead component attached to said solder pads associated with the first and second component pads; and
    a second two-lead component attached to said solder pads associated with the third and fourth component pads.

2. The PCB of claim 1, wherein the tight-pitch grid pattern is square.

3. The PCB of claim 2, wherein the tight-pitch grid pattern has 0.8 mm pitch.

4. The PCB of claim 3, wherein the Imperial 0201 component is a discrete component.

5. The PCB of claim 1, wherein the tight-pitch grid pattern is rectangular.

6. The PCB of claim 1, wherein the two-lead component is an Imperial 0201 component.

7. The PCB of claim 6, wherein the Imperial 0201 component is a capacitor.

* * * * *